(12) United States Patent
Liu et al.

(10) Patent No.: US 10,827,631 B2
(45) Date of Patent: Nov. 3, 2020

(54) FOLDABLE DISPLAY AND FOLDABLE DISPLAY DEVICE

(71) Applicant: BOE TECHNOLOGY GROUP CO., LTD., Beijing (CN)

(72) Inventors: Lu Liu, Beijing (CN); Paoming Tsai, Beijing (CN); Dejun Bu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/422,395

(22) Filed: May 24, 2019

(65) Prior Publication Data
US 2019/0373743 A1 Dec. 5, 2019

(30) Foreign Application Priority Data

May 31, 2018 (CN) .......................... 2018 1 0556675

(51) Int. Cl.
*H05K 5/00* (2006.01)
*H05K 5/02* (2006.01)

(52) U.S. Cl.
CPC ......... *H05K 5/0017* (2013.01); *H05K 5/0217* (2013.01)

(58) Field of Classification Search
CPC ........................... H05K 5/0017; H05K 5/0217
See application file for complete search history.

(56) References Cited

U.S. PATENT DOCUMENTS 9,173,288 B1* 10/2015 Kim ....................... G06F 1/1633
9,235,239 B2* 1/2016 van Dijk ............... G06F 1/1652
9,760,126 B2* 9/2017 Shin ....................... G06F 1/1652
9,786,207 B2* 10/2017 Kim ....................... G06F 1/1641
9,910,458 B2* 3/2018 Watanabe ................. G09F 9/00
10,015,897 B1* 7/2018 Hong ....................... G09F 9/301
10,185,364 B2* 1/2019 Seo ......................... G06F 1/1652
(Continued)

FOREIGN PATENT DOCUMENTS

CN 106711349 A 5/2017
CN 106713542 A 5/2017
(Continued)

OTHER PUBLICATIONS

First Office Action issued in corresponding Chinese Application No. 201810556675.2, dated Dec. 4, 2019, with English translation.

*Primary Examiner* — Hoa C Nguyen
*Assistant Examiner* — Keith DePew
(74) *Attorney, Agent, or Firm* — McDermott Will & Emery LLP

(57) ABSTRACT

A foldable display has a foldable area. The foldable display includes: a flexible display screen having a display surface and a back surface opposite to the display surface; a foldable mechanism fastened on the back surface of the flexible display screen; and a elastic portion disposed between the foldable mechanism and the flexible display screen. The elastic portion is connected to the foldable mechanism and the flexible display screen. At least a part of the elastic portion is located in the foldable area. The at least a part of the elastic portion located in the foldable area is configured to elastically deform as the flexible display screen and the foldable mechanism are synchronously switched between a folded state and a flattened out state.

17 Claims, 4 Drawing Sheets

(56) References Cited

U.S. PATENT DOCUMENTS

| | | | |
|---|---|---|---|
| 10,234,905 B2* | 3/2019 | Chen | H04M 1/0216 |
| 2010/0117975 A1 | 5/2010 | Cho | |
| 2012/0307423 A1* | 12/2012 | Bohn | G06F 1/1652 |
| | | | 361/679.01 |
| 2013/0037228 A1* | 2/2013 | Verschoor | G06F 1/1652 |
| | | | 160/377 |
| 2016/0070306 A1* | 3/2016 | Shin | G06F 1/1616 |
| | | | 361/679.27 |
| 2017/0374749 A1* | 12/2017 | Lee | H05K 5/0086 |
| 2018/0146560 A1* | 5/2018 | Chen | G02F 1/133308 |
| 2018/0233695 A1 | 8/2018 | Wang et al. | |
| 2019/0098775 A1* | 3/2019 | Cho | H05K 5/0226 |
| 2019/0131553 A1* | 5/2019 | Park | H01L 51/5237 |
| 2019/0132947 A1* | 5/2019 | Koo | G02F 1/133305 |
| 2019/0132987 A1* | 5/2019 | Koo | H04M 1/0214 |
| 2019/0166703 A1* | 5/2019 | Kim | G06F 1/1652 |
| 2019/0174645 A1* | 6/2019 | Jeon | H05K 5/0226 |
| 2019/0200466 A1* | 6/2019 | Kim | H05K 5/0017 |

FOREIGN PATENT DOCUMENTS

| | | |
|---|---|---|
| CN | 107067979 A | 8/2017 |
| CN | 107437378 A | 12/2017 |

\* cited by examiner

FOLDABLE DISPLAY AND FOLDABLE DISPLAY DEVICE

CROSS-REFERENCE TO RELATED APPLICATION

This application claims priority and benefits to Chinese Patent Application No. 201810556675.2, filed on May 31, 2018, titled "FOLDABLE DISPLAY AND FOLDABLE DISPLAY DEVICE", which is incorporated herein by reference in its entirety.

TECHNICAL FIELD

The present disclosure relates to the field of flexible display technologies, and in particular, to a foldable display and a foldable display device.

BACKGROUND

With the development of technology, a bend radius R of flexible display screens is gradually reduced from 30 mm~15 mm (products each with a wristband) to 5 mm (foldable products), and then to 1 mm (rollable products and foldable products). Due to their foldability, flexible displays can be more varied in shape to meet a variety of different user requirements.

SUMMARY

In an aspect, a foldable display is provided, which has a foldable area. The foldable display includes: a flexible display screen having a display surface and a back surface opposite to the display surface; a foldable mechanism fastened on a back surface of the flexible display screen; and a elastic portion disposed between the foldable mechanism and the flexible display screen. The elastic portion is connected to the foldable mechanism and the flexible display screen. At least a part of the elastic portion is located in the foldable area, and the at least a part of the elastic portion located in the foldable area is configured to elastically deform as the flexible display screen and the foldable mechanism are synchronously switched between a folded state and a flattened out state.

In some embodiments, the elastic portion includes a first elastic portion and a second elastic portion which are located in a non-foldable area, and an intermediate elastic portion located in the foldable area, an elastic force of the first elastic portion is equal to an elastic force of the second elastic portion, and the elastic force of the first elastic portion and the second elastic portion is greater than an elastic force of the intermediate elastic portion.

In some embodiments, the elastic portion is entirely disposed in the foldable area, a portion of the back surface of the flexible display screen located in the foldable area and/or a portion of a connecting surface of the foldable mechanism facing the back surface located in the foldable area is provided with a first groove, and the first groove receives the elastic portion.

In some embodiments, the portion of the connecting surface of the foldable mechanism located in the foldable area is provided with the first groove, and the portion of the back surface of the flexible display screen opposite to the display surface located in the foldable area is provided with a plurality of second grooves that are spaced apart. The flexible display screen and the foldable mechanism are configured to be folded synchronously to increase or decrease opening widths of tops of the plurality of second grooves.

In some embodiments, the portion of the back surface of the flexible display screen located in the foldable area is provided with the first groove, and a bottom surface of the first groove is provided with a plurality of second grooves that are spaced apart.

In some embodiments, each second groove has a triangular cross section in a plane perpendicular to an extending direction of the first groove.

In some embodiments, the elastic portion includes at least one elastic member, and an end of each elastic member is connected to the connecting surface of the foldable mechanism, and another end of the elastic member is connected to the back surface of the flexible display screen.

In some embodiments, each elastic member is slidably connected to the connecting surface of the foldable mechanism and/or the back surface of the flexible display screen, so that the at least one elastic member is slidable relative to the foldable mechanism and/or the flexible display screen during a process in which the flexible display screen and the foldable mechanism are folded and flattened out synchronously.

In some embodiments, the foldable display further includes attracting members, and two attracting members cooperate with each other. Each elastic member is slidably connected to the foldable mechanism or the flexible display screen by two attracting members that are attracted to each other, and the two attracting members are slidable relative to each other during a process in which the flexible display screen and the foldable mechanism are folded and flattened out synchronously.

In some embodiments, surfaces of two attracting members that cooperate with each other are curved surfaces.

In some embodiments, of the two attracting members, one attracting member is fastened on the flexible display screen and is ball-shaped, and another attracting member is fastened on one end of a corresponding elastic member of the at least one elastic member close to the flexible display screen and is bowl-shaped.

In some embodiments, the two attracting members are both magnetic elements.

In some embodiments, the elastic portion includes a plurality of springs, and the plurality of springs are arranged in an array in the first groove.

In some embodiments, the plurality of second grooves all extend in a same direction as an extending direction of the first groove, and the plurality of second grooves are evenly arranged in a width direction of the first groove.

In some embodiments, one end of each spring close to the flexible display screen is connected to a spacing portion between two adjacent second grooves.

In some embodiments, the flexible display screen includes a functional film fastened to the foldable mechanism, and the plurality of second grooves are provided in a surface of the functional film adjacent to the foldable mechanism and do not penetrate the functional film.

In another aspect, a foldable display device is provided, which includes the foldable display described above.

BRIEF DESCRIPTION OF THE DRAWINGS

In order to describe technical solutions in embodiments of the present disclosure or in the related art more clearly, the accompanying drawings to be used in the description of embodiments or the related art will be introduced briefly.

Obviously, the accompanying drawings to be described below are merely some embodiments of the present disclosure, and a person of ordinary skill in the art can obtain other drawings according to those drawings without paying any creative effort.

DETAILED DESCRIPTION

Figure 1:
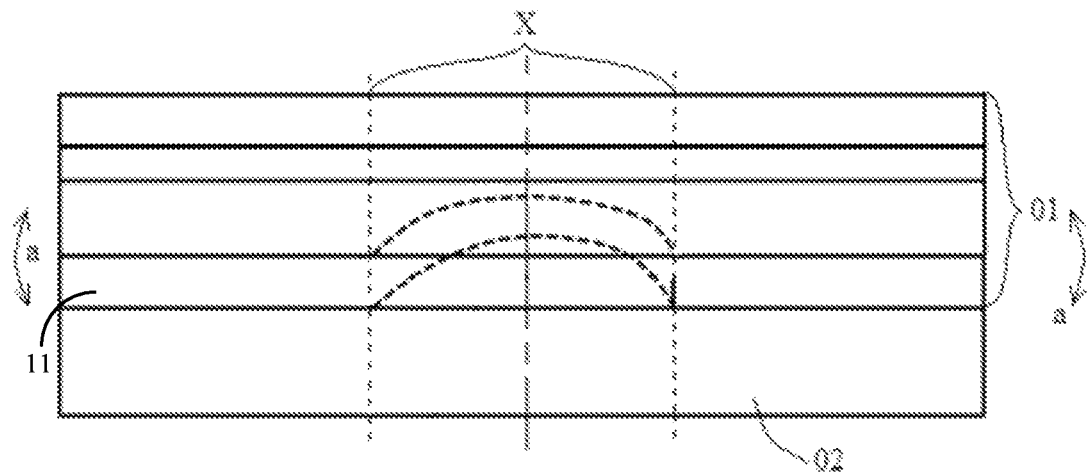
FIG. 1 is a schematic diagram of a foldable display in the related art.

The technical solutions in the embodiments of the present disclosure will be described clearly and completely below with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

It will be understood that in the description of the present disclosure, orientations or positional relationships indicated by terms "center", "upper", "lower", "front", "rear", "left", "right", "vertical", "horizontal", "top", "bottom", "inner", "outer", etc. are based on orientations or positional relationships shown in the drawings, merely to facilitate and simplify the description of the present disclosure, but not to indicate or imply that the referred devices or elements must have a particular orientation, or must be constructed or operated in a particular orientation. Therefore they should not be construed as limitations to the present disclosure.

Terms "first" and "second" are used for descriptive purposes only and are not to be construed as indicating or implying the relative importance or implicitly indicating the number of indicated technical features. Thus, features defined as "first", "second" may explicitly or implicitly include one or more of the features. In the description of the present disclosure, "plurality" means two or more unless otherwise specified.

In the description of the present disclosure, it will be noted that terms "mounted", "connected", and "connection" should be understood in a broad sense unless specifically defined or limited. For example, it may be a permanent connection, a detachable connection, or it may be an integrated connection; it may be directly connected, indirectly connected through an intermediate medium, or it may be internal connection between two components. For a person of ordinary skill in the art, specific meanings of the above terms in the present disclosure can be understood according to specific circumstances.

Referring to FIG. 1, in the related art, a foldable display (foldable product) usually includes a flexible display screen 01 and a foldable mechanism 02, and the flexible display screen 01 includes a functional film 11. The flexible display screen 01 is closely fitted to and fastened to the foldable mechanism 02. In this way, the foldable mechanism 02 can drive the flexible display screen 01 to fold in a folding direction a as shown in FIG. 1. A bend radius R of the flexible display screen 01 is a radius of curvature formed by folding the flexible display screen along the folding direction a. However, due to a large stress at a foldable area X of the foldable display, the foldable display is not easily folded. Moreover, since the flexible display screen 01 is closely fitted to the foldable mechanism 02, a structure of the functional film 11 will be changed when the flexible display is folded, causing the flexible display screen 01 to be detached from the foldable mechanism 02 and resulting in poor display quality of the foldable display.

In addition, when the foldable display is flattened out from a folded state, the flexible display screen 01 cannot be quickly restored to a flat state due to resilience of a material of the flexible display screen 01. As a result, a portion of the functional film 11 located in the foldable area X will still be in a bent state, i.e., a raised state (shown by dotted lines in FIG. 1). Consequently, the flexible display screen 01 and the foldable mechanism 02 cannot be closely fitted to each other due to the raised state of the portion of the functional film 11, thereby causing the display quality of the foldable display to be poor and affecting user experience.

Figure 3:
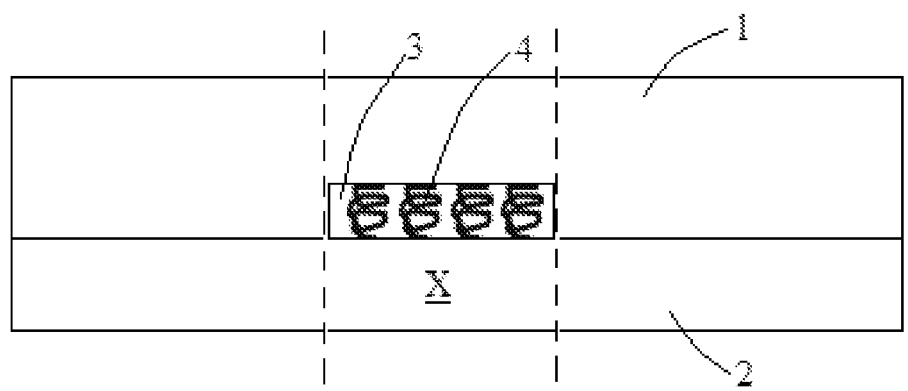
FIG. 3 is a schematic diagram of another foldable display in which a flexible display screen is provided with a first groove, in accordance some embodiments.
Figure 4:
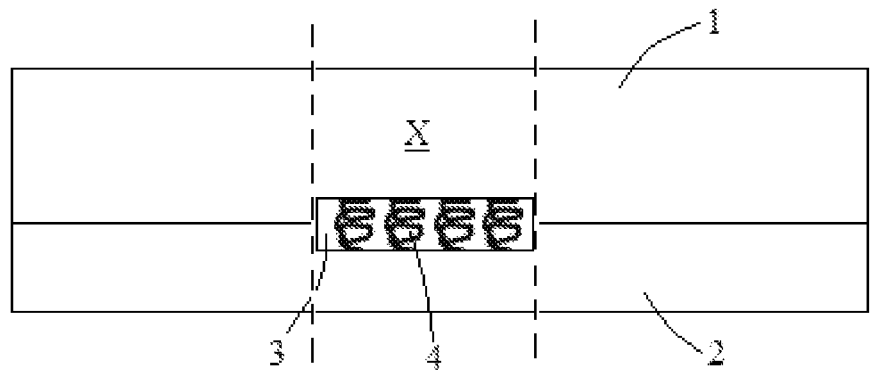
FIG. 4 is a schematic diagram of yet another foldable display in which a foldable mechanism and a flexible display screen are both provided with a first groove, in accordance with some embodiments.
Figure 5:
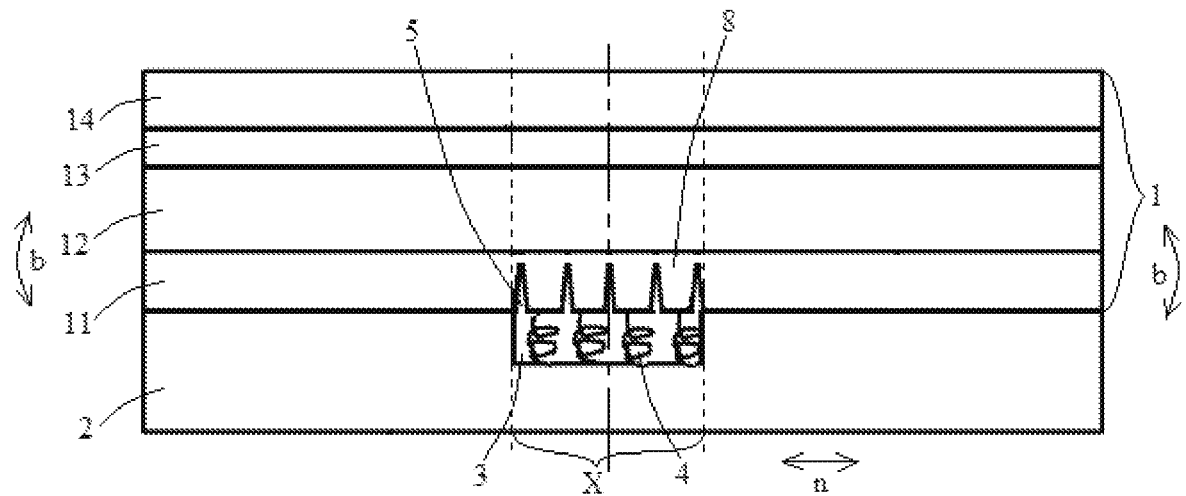
FIG. 5 is a schematic diagram of yet another foldable display in which second grooves are provided, in accordance with some embodiments.
Figure 6:
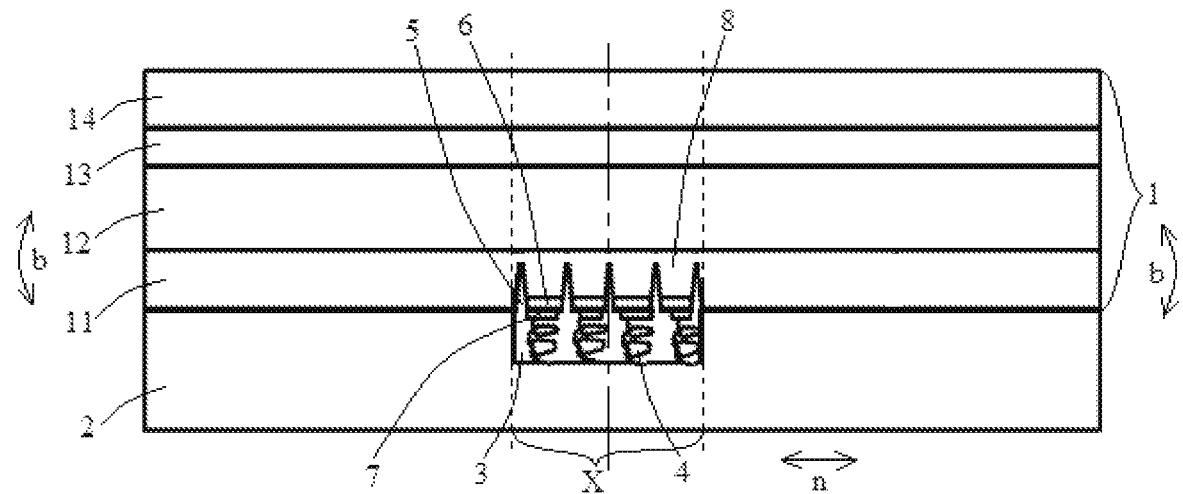
FIG. 6 is a schematic diagram of yet another foldable display, in accordance with some embodiments.

Referring to FIGS. 2 to 10, some embodiments of the present disclosure provide a foldable display. The foldable display has a foldable area X that is foldable. The foldable display includes a flexible display screen 1 having a display surface and a back surface opposite to the display surface, and a foldable mechanism 2 fastened on the back surface of the flexible display screen 1. The foldable mechanism 2 is configured to drive the flexible display screen 1 to fold in a folding direction b as shown in FIGS. 5 and 6. The foldable display screen 1 and the foldable mechanism 2 are configured to be folded and flattened out synchronously.

Figure 9:
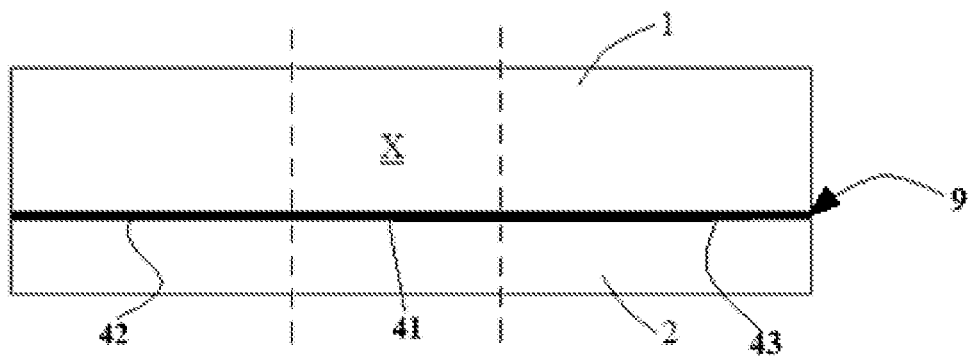
FIG. 9 is a schematic diagram of yet another foldable display, in accordance with some embodiments.

Referring again to FIGS. 2 and 9, the foldable display further includes a elastic portion 9 disposed between the foldable mechanism 2 and the flexible display screen 1, and the elastic portion 9 is connected to the foldable mechanism 2 and the flexible display screen 1. At least a part of the elastic portion 9 is located in the foldable area X. In some examples, the elastic portion 9 is entirely located in the foldable area X through a groove. In some other examples, a part of the elastic portion 9 (i.e., an intermediate elastic portion described thereinafter) is located in the foldable area X. For example, as shown in FIG. 9, the the elastic portion 9 is disposed between the foldable mechanism 2 and the flexible display screen 1 in a form of a sheet with a size equal to the size of the foldable mechanism 2 and the flexible display screen 1. The at least a part of the elastic portion 9 located in the foldable area X is configured to elastically deform as the flexible display screen 1 and the foldable mechanism 2 are synchronously switched between a folded state and a flattened out state.

In this way, when the flexible display screen 1 and the foldable mechanism 2 are synchronously folded, the at least a part of the elastic portion 9 located in the foldable area X will present elastic deformation. In addition, when the flexible display screen 1 and the foldable mechanism 2 are synchronously flattened out, the at least a part of the elastic portion 9 located in the foldable area X will returns to its original state, which will drive the portion of the flexible display screen 1 located in the foldable area X to return its flattened out state. Therefore, when the flexible display is flattened out after it is folded, the portion of the functional film 11 of the flexible display screen 1 located in the foldable area X will not be in the raised state, thereby improving the display quality of the foldable display.

In some embodiments, referring to FIG. 9, a size of the elastic portion 9 is greater than a size of the foldable area X of the foldable display and is equal to a size of the flexible display screen 1 and the foldable mechanism 2. In addition, no groove is provided in the the flexible display screen 1 and the foldable mechanism 2. In this case, the elastic portion 9 is directly disposed between the flexible display screen 1 and the foldable mechanism 2. The elastic portion 9 includes a first elastic portion 42, an intermediate elastic portion 41 which is located in the foldable area X, and a second elastic portion 43. The first elastic portion 42, the intermediate elastic portion 41 and the second elastic portion 43 are defined by the dotted lines in FIG. 9. In addition, an elastic force of the first elastic portion 42 is equal to an elastic force of the second elastic portion 43, and the elastic force of the first elastic portion 42 and the second elastic portion 43 is greater than an elastic force of the intermediate elastic portion 41.

In this way, the first elastic portion 42 and the second elastic portion 43 have a greater elastic force, thereby preventing the portions located in the non-foldable area from deforming due to the larger size of the elastic portion 9. For example, during the folding process, the first elastic portion 42 and the second elastic portion 43 may well offset the influence of the bending force on the non-foldable area due to the large elastic force (for example, wrinkles may appear in the non-foldable area due to the bending force), thereby ensuring the fit of the flexible display screen 1 and the foldable mechanism 2. In this way, the display failure of the foldable display may be avoided, thereby improving the user experience.

Figure 2:
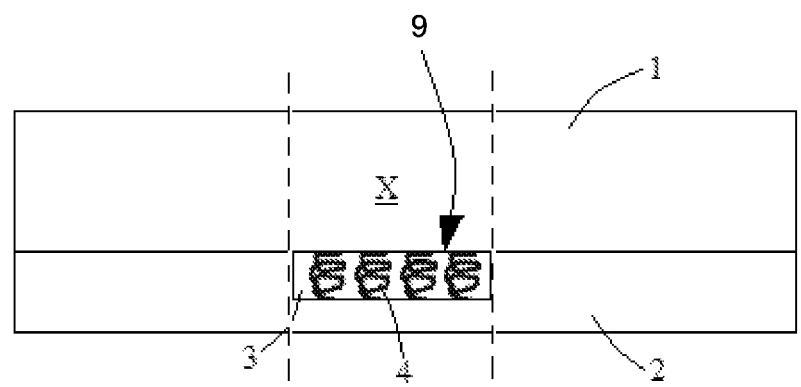
FIG. 2 is a schematic diagram of a foldable display in which a foldable mechanism is provided with a first groove, in accordance with some embodiments.

In some other embodiments, referring to FIGS. 2-4, the elastic portion 9 is entirely located in the foldable area X, and a portion of the back surface of the flexible display screen 1 located in the foldable area X and/or a portion of a connecting surface of the foldable mechanism 2 facing the back surface located in the foldable area X is provided with a first groove 3. The first groove 3 receives the elastic portion 9. In this way, the stress at the foldable area X may be reduced, and it may be easier to fold the foldable display. In addition, the possibility of the portion of the flexible display screen located in the foldable area X being in the raised state may be reduced. In this way, the portions of the flexible display screen and the foldable mechanism located in the non-foldable area will be closely fitted to each other, thereby improving the display quality of the foldable display.

In some examples, referring to FIG. 2, the portion of the connection surface of the foldable mechanism 2 located in the foldable area X is provided with a first groove 3, and the first groove 3 receives the elastic portion 9.

In some other examples, referring to FIG. 3, the portion of the back surface of the flexible display screen 1 located in the foldable area X is provided with a first groove 3, and the first groove 3 receives the elastic portion 9.

In some other examples, referring to FIG. 4, each of the portion of the connection surface of the foldable mechanism 2 and the portion of the back surface of the flexible display screen 1 located in the foldable area X is provided with a first groove 3, and the two first grooves 3 are disposed opposite to each other to form a space for receiving the elastic portion 9.

In some embodiments, referring to FIGS. 2-6, the elastic portion 9 includes at least one elastic member 4, and one end of each elastic member 4 is connected to the connection surface of the foldable mechanism 2 facing the back surface of the flexible display screen 1, and another end of the elastic member 4 is connected to the back surface of the flexible display screen 1. The at least one elastic member 4 is configured to elastically deform as the flexible display screen and the foldable mechanism are synchronously switched between a folded state and a flattened out state.

For example, when the flexible display screen 1 and the foldable mechanism 2 are folded synchronously, each elastic member 4 will elastically deform to apply an elastic force on the flexible display screen 1 (i.e., a force opposite to a folding force exerted on the flexible display screen), so as to balance the stress and strain at the foldable area X. In addition, when the flexible display screen 1 and the foldable mechanism 2 are flattened out synchronously, each elastic member 4 will be restored to an original length to drive the portion of the flexible display screen 1 located in the foldable area X to restore to a flat state, so as to balance the stress and strain at the foldable area X. Therefore, when the foldable display is flattened out after being folded, a bottom of the first groove 3 of the flexible display screen 1 will not be in a raised state. As a result, the flexible display screen 1 and the foldable mechanism 2 may still be closely fitted to each other, thereby enhancing the display quality of the display screen and improving user experience.

In some embodiments, referring to FIG. 5, the portion of the connecting surface of the foldable mechanism 2 located in the foldable area X is provided with the first groove 3, and the portion of the back surface of the flexible display screen 1 located in the foldable area X is provided with a plurality of second grooves 5 that are spaced apart. That is, the first groove 3 and the plurality of second grooves 5 are disposed opposite to each other. The synchronous folding of the flexible display screen 1 and the foldable mechanism 2 will increase or decrease opening widths of tops of the plurality of second grooves 5 in a width direction n of the foldable display, thereby balancing the stress during a folding process and making it even easier to fold the flexible display.

In some other embodiments, the flexible display screen 1 is provided with the first groove 3, and the bottom of the first groove 3 is provided with second grooves 5.

Figure 10:
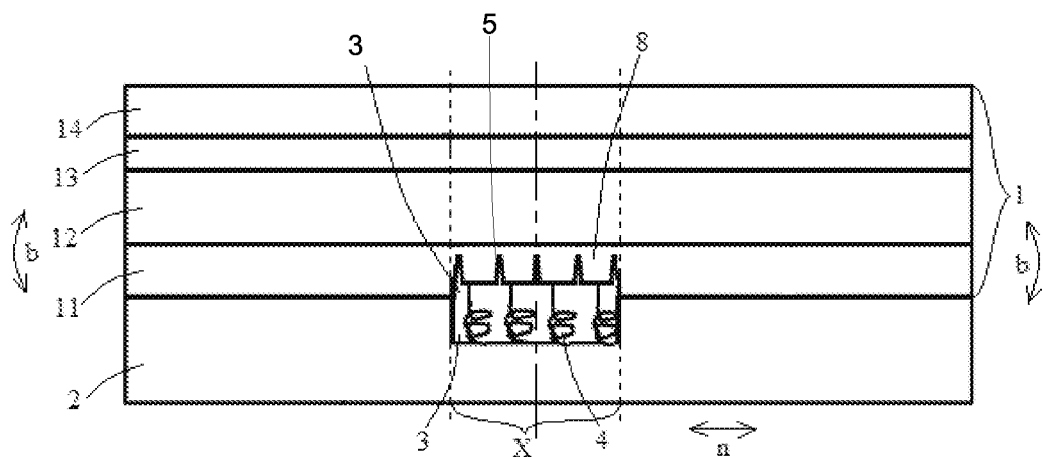
FIG. 10 is a schematic diagram of yet another foldable display in which second grooves are provided, in accordance with some embodiments.

In some other embodiments, referring to FIG. 10, the folding mechanism 2 and the flexible display screen 1 are both provided with the first groove 3, and the bottom of the first groove 3 of the flexible display screen 1 is provided with second grooves 5.

In some embodiments, each second groove 5 has a rectangle cross section in a plane perpendicular to the extending direction m of the first groove 3. In some other embodiments, referring to FIGS. 5 and 7, each second groove 5 has a triangular cross section in the plane perpendicular to an extending direction m of the first groove 3. In this way, in a case where opening widths of tops of the second grooves 5 of the flexible display screen 1 are increased and decreased to same sizes under an external force when folding and flattening out the foldable display, since a triangle has a smaller size, a design in which each second groove 5 has a triangular cross section may have a smaller impact on a structure of the flexible display screen 1. Each second groove 5 may also have cross sections of other shapes such as a trapezoid in the plane perpendicular to the extending direction m of the first groove 3.

In some embodiments, each elastic member 4 is slidably connected to the foldable mechanism 2 and/or the flexible display screen 1, so that each elastic member 4 is slidable relative to the foldable mechanism 2 and/or the flexible display screen 1 during a process in which the flexible display screen 1 and the foldable mechanism 2 are synchronously switched between a folded state and a flattened out state, so as to balance and absorb the stress and make it even easier to fold the foldable display.

Figure 8:
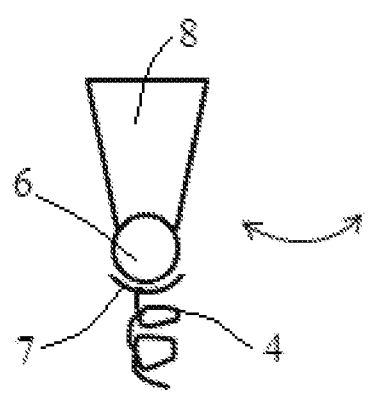
FIG. 8 is a schematic diagram of two attracting members in a foldable display, in which one attracting member fastened on a flexible display screen is ball-shaped, and another attracting member fastened on an elastic member is bowl-shaped, in accordance with some embodiments.

In some embodiments, referring to FIGS. 6 and 8, the foldable display includes attracting members, and each two attracting members such as the first attracting member 6 and the second attracting member 7 cooperate with each other. In some examples, each elastic member 4 and the foldable mechanism 2 are provided with two attracting members that cooperate with each other therebetween, and the two attracting members are configured such that the elastic member 4 is slidably connected to the foldable mechanism 2. For example, each elastic member 4 is slidably connected to the foldable mechanism 2 by two attracting members 6 and 7 that cooperate with to each other, and the elastic member 4 is fixedly connected to the flexible display screen 1. For example, the elastic member 4 is fixedly connected to the flexible display screen 1 by welding.

In some other examples, each elastic member 4 and the foldable mechanism 2 are provided with two attracting members therebetween, the elastic member 4 and the flexible display screen 1 are provided with two attracting members that cooperate with each other therebetween, and these attracting members are configured such that the elastic member 4 is slidably connected to the foldable mechanism 2 and the flexible display screen 1.

In some other examples, referring to FIGS. 6 and 8, each elastic member 4 and the flexible display screen 1 are provided with two attracting members that cooperate with each other therebetween, and the two attracting members are configured such that the elastic member 4 is slidably connected to the flexible display screen 1. For example, referring to FIG. 6, each elastic member 4 is connected to the flexible display screen 1 by two attracting members 6 and 7 that cooperate with to each other, and the elastic member 4 is fixedly connected to the foldable mechanism 2. For example, the elastic member 4 is fixedly connected to the foldable mechanism 2 by welding. In this way, during a process in which the flexible display screen 1 and the foldable mechanism 2 are synchronously switched between a folded state and a flattened out state, the first attracting member 6 and the second attracting member 7 may cooperate together to slide relative to each other, so that each elastic member 4 is slidable relative to the flexible display screen 1.

In a case where an elastic member 4 is slidably connected to the foldable mechanism 2 by the first attracting member 6 and the second attracting member 7, one of the first attracting member 6 and the second attracting member 7 is disposed on the foldable mechanism 2, and another one of the first attracting member 6 and the second attracting member 7 is disposed on an end of the elastic member close to the foldable mechanism 2. In a case where an elastic member 4 is slidably connected to the flexible display screen 1 by the first attracting member 6 and the second attracting member 7, one of the first attracting member 6 and the second attracting member 7 is disposed on the flexible display screen 1, and another one of the first attracting member 6 and the second attracting member 7 is disposed on an end of the elastic member 4 close to the flexible display screen 1. In addition, each elastic member 4 may also be slidably connected to the foldable mechanism 2 and/or the flexible display screen 1 by other structures, for example, by sliding block(s) and sliding groove(s) that are matched with each other. In this case, the sliding block is disposed on an end of the elastic member 4, and the sliding groove is disposed on the flexible display screen 1 or the foldable mechanism 2.

In some embodiments, referring to FIG. 8, a surface of the first attracting member 6 and a surface of the second attracting member 7 that face each other are both curved surfaces, which is more advantageous for the first attracting member 6 and the second attracting member 7 to slide relatively along a direction indicated by the arrow in FIG. 8 to balance the stress at the portion of the flexible display screen 1 located in the foldable area X.

In some examples, referring to FIG. 8, the first attracting member 6 fastened on the flexible display screen 1 is ball-shaped, and the second attracting member 7 fastened on one end of a corresponding elastic member 4 close to the flexible display screen 1 is bowl-shaped. With this design, the first attracting member 6 and the second attracting member 7 will have simpler structures and will be easier to manufacture. In some embodiments, the first attracting member 6 and the second attracting member 7 are both magnetic elements, so that the two attracting members are more firmly cooperating with each other.

FIGS. 2-6 show an example in which the at least one elastic member 4 includes a plurality of elastic members 4, for example, four elastic members 4. In some other examples, the at least one elastic member 4 includes a single elastic member 4, and the elastic member 4 is able to elastically deform to balance a stress and strain in the foldable area X.

Figure 7:
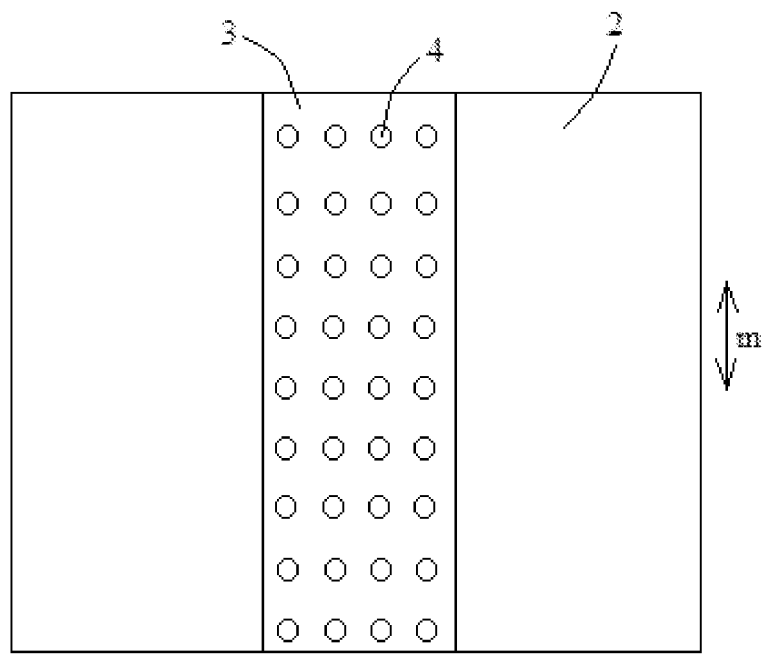
FIG. 7 is a top view of a foldable mechanism in a foldable display, in accordance with some embodiments.

For example, the at least one elastic member 4 includes a plurality of elastic members 4, and each elastic member is a spring. The plurality of springs are arranged in an array in the first groove 3, as shown in FIG. 7. In this way, when the flexible display screen 1 and the foldable mechanism 2 are synchronously switched from a folded state to a flattened out state, the plurality of springs may all be restored to original lengths thereof to drive different positions of the bottom of the first groove 3 of the flexible display screen 1, so that the bottom of the first groove 3 is quickly restored to a flat state.

In some embodiments, referring to FIGS. 6 and 7, the plurality of second grooves 5 all extend in a same direction as the extending direction m of the first groove 3. The plurality of second grooves 5 are spaced apart and evenly arranged in the width direction n of the foldable display, so as to better balance the stress during processes in which the foldable display is folded and flattened out, and thus further improve a folding effect of the foldable display. As shown in FIG. 6, the second grooves 5 are five second grooves 5 and four spacing portions 8 each are disposed between two adjacent second grooves 5. One end of each spring close to the flexible display screen 1 is slidably connected to an spacing portion 8 between two adjacent second grooves 5 by the first attracting member 6 and the second attracting member 7 that cooperate with each other, the first attracting member 6 is fastened on the spacing portion 8, and the second attracting member 7 is fastened on the end of the spring close to the flexible display screen 1. This design may prevent the spring from becoming an obstacle that hinders an opening width of the top of the second groove 5 from being changed.

In some embodiments, referring to FIGS. 5 and 6, the flexible display screen 1 includes a functional film 11 that is in contact with and fastened to the foldable mechanism 2, and the back surface of the flexible display screen 1 described above is a surface of the functional film 11 contacting with the foldable mechanism 2. The functional film 11 is used for dissipating heat and resisting impact. In some embodiments, the flexible display screen 1 further includes a back film 12, a flexible substrate 13, and a display element 14 which are disposed at a side of the functional film 11 away from the foldable mechanism 2. The plurality of second grooves 5 are provided in the functional film 11 and do not penetrate the functional film 11, which ensures a stability of a structure of the flexible display screen 1.

In some other embodiments, the flexible display screen 1 includes the back film 12 but does not include the functional film 11, and the back surface of the flexible display screen 1 is a surface of the back film 12 contacting with the foldable mechanism 2. Herein, the functional film 11 is an optional structure.

Some embodiments of the present disclosure provide a foldable display device, which includes the foldable display described above. The foldable display device is, for example, a foldable mobile communication terminal, a foldable electronic notebook, a foldable e-book, a foldable portable multimedia player (PMP), a foldable navigation device, a foldable ultra mobile personal computer (PC), a foldable mobile phone, a foldable smart phone, a foldable tablet computer, a foldable electronic newspaper, a foldable TV set, a foldable monitor, etc. The foldable display device provided by some embodiments of the present disclosure has the same advantageous effects as the foldable display described above, and details are not described herein again.

Other configurations of the foldable display device provided by embodiments of the present disclosure are well known to those skilled in the art and will not be described in detail herein.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A foldable display having a foldable area, the foldable display comprising:
   a flexible display screen having a display surface and a back surface opposite to the display surface;
   a foldable mechanism fastened on the back surface of the flexible display screen; and
   an elastic portion disposed between the foldable mechanism and the flexible display screen, wherein the elastic portion is connected to the foldable mechanism and the flexible display screen, the elastic portion is located in the foldable area, and the elastic portion is configured to elastically deform as the flexible display screen and the foldable mechanism are synchronously switched between a folded state and a flattened out state,
   a first groove, which is provided at least in a portion of the back surface of the flexible display screen located in the foldable area, wherein the first groove receives the elastic portion; and
   a plurality of second grooves spaced apart from each other, which are provided in a bottom surface of the first groove.

2. The foldable display according to claim 1, wherein the first groove is also provided in a portion of a connecting surface of the foldable mechanism facing the back surface located in the foldable area.

3. The foldable display according to claim 1, wherein each second groove has a triangular cross section in a plane perpendicular to an extending direction of the first groove.

4. The foldable display according to claim 1, wherein the elastic portion includes at least one elastic member, and an end of each elastic member is connected to the connecting surface of the foldable mechanism, and another end of the elastic member is connected to the back surface of the flexible display screen.

5. The foldable display according to claim 4, wherein each elastic member is slidably connected to at least one of the connecting surface of the foldable mechanism or the back surface of the flexible display screen, so that the at least one elastic member is slidable relative to at least one of the foldable mechanism or the flexible display screen during a process in which the flexible display screen and the foldable mechanism are folded and flattened out synchronously.

6. The foldable display according to claim 5, further comprising attracting members, each of two attracting members cooperating with each other, wherein
   each elastic member is slidably connected to the foldable mechanism or the flexible display screen by two attracting members that cooperate with each other, and the two attracting members are slidable relative to each other during a process in which the flexible display screen and the foldable mechanism are folded and flattened out synchronously.

7. The foldable display according to claim 6, wherein surfaces of two attracting members that cooperate with each other are curved surfaces.

8. The foldable display according to claim 7, wherein of the two attracting members, one adsorbing member is fastened on the flexible display screen and is ball-shaped, and another attracting member is fastened on one end of a corresponding one of the at least one elastic member close to the flexible display screen and is bowl-shaped.

9. The foldable display according to claim 6, wherein the two attracting members are both magnetic elements.

10. The foldable display according to claim 1, wherein the elastic portion includes a plurality of springs, and the plurality of springs are arranged in an array in the first groove.

11. The foldable display according to claim 10, wherein the plurality of second grooves all extend in a same direction as an extending direction of the first groove, and the plurality of second grooves are evenly arranged in a width direction of the first groove.

12. The foldable display according to claim 11, wherein one end of each spring close to the flexible display screen is connected to a spacing portion between two adjacent second grooves.

13. The foldable display according to claim 1, wherein the flexible display screen includes a functional film fastened to the foldable mechanism, and the plurality of second grooves are provided in a surface of the functional film adjacent to the foldable mechanism and do not penetrate the functional film.

14. A foldable display device, comprising the foldable display according to claim 1.

15. A foldable display having a foldable area, the foldable display comprising:
- a flexible display screen having a display surface and a back surface opposite to the display surface;
- a foldable mechanism fastened on the back surface of the flexible display screen; and
- an elastic portion disposed between the foldable mechanism and the flexible display screen, wherein the elastic portion is connected to the foldable mechanism and the flexible display screen, the elastic portion is located in the foldable area, and the elastic portion is configured to elastically deform as the flexible display screen and the foldable mechanism are synchronously switched between a folded state and a flattened out state,
- a first groove, which is provided in a portion of a connecting surface of the foldable mechanism located in the foldable area, wherein the connecting surface faces the back surface, wherein the first groove receives the elastic portion;
- a plurality of second grooves spaced apart from each other, which are provided in a portion of the back surface of the flexible display screen located in the foldable area, wherein the flexible display screen and the foldable mechanism are configured to be folded synchronously to increase or decrease opening widths of tops of the plurality of second grooves,
- wherein the elastic portion includes a plurality of springs, and the plurality of springs are arranged in an array in the first groove.

16. The foldable display according to claim 15, wherein each second groove has a triangular cross section in a plane perpendicular to an extending direction of the first groove.

17. The foldable display according to claim 15, wherein the flexible display screen includes a functional film fastened to the foldable mechanism, and the plurality of second grooves are provided in a surface of the functional film adjacent to the foldable mechanism and do not penetrate the functional film.

* * * * *